US009385487B2

(12) United States Patent
Wu et al.

(10) Patent No.: US 9,385,487 B2
(45) Date of Patent: Jul. 5, 2016

(54) ACTIVE PLUG CONNECTOR AND METHOD FOR ASSEMBLING THE SAME

(71) Applicant: HON HAI PRECISION INDUSTRY CO., LTD., New Taipei (TW)

(72) Inventors: Jerry Wu, Irvine, CA (US); Qing-Man Zhu, Kunshan (CN); Jian-Jun Zhu, Kunshan (CN); Xiao-Feng Li, Kunshan (CN); Dong-Qi Kuang, Kunshan (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/328,724

(22) Filed: Jul. 11, 2014

(65) Prior Publication Data

US 2015/0017836 A1 Jan. 15, 2015

(30) Foreign Application Priority Data

Jul. 11, 2013 (CN) .......................... 2013 1 0290362
Jul. 11, 2013 (CN) .......................... 2013 1 0290789

(51) Int. Cl.
*H05K 1/00* (2006.01)
*H01R 13/66* (2006.01)
*H01R 12/73* (2011.01)

(52) U.S. Cl.
CPC ............ *H01R 13/6658* (2013.01); *H01R 12/73* (2013.01); *Y10T 29/4913* (2015.01)

(58) Field of Classification Search
CPC .... H01R 13/6658; H01R 13/58; H01R 13/46; H01R 12/72; H01R 12/73; Y10T 29/4913
USPC ............ 439/74, 75, 76.1, 628, 629, 632, 638, 439/620.21, 620.42, 620.01, 44, 45
See application file for complete search history.

(56) References Cited

U.S. PATENT DOCUMENTS

| | | | | |
|---|---|---|---|---|
| 5,567,167 | A * | 10/1996 | Hayashi | 439/75 |
| 5,772,452 | A * | 6/1998 | Aoyama | H01R 12/73 439/74 |
| 6,024,589 | A * | 2/2000 | Hahn et al. | 439/212 |
| 6,027,345 | A * | 2/2000 | McHugh et al. | 439/66 |
| 6,945,786 | B2 * | 9/2005 | Ammar et al. | 439/65 |
| 7,090,502 | B2 * | 8/2006 | Ono et al. | 439/65 |
| 7,320,609 | B1 * | 1/2008 | Minich | 439/79 |

(Continued)

FOREIGN PATENT DOCUMENTS

| | | |
|---|---|---|
| CN | 101562289 A | 10/2009 |
| CN | 201450141 U | 5/2010 |

(Continued)

*Primary Examiner* — Amy Cohen Johnson
*Assistant Examiner* — Milagros Jeancharles
(74) *Attorney, Agent, or Firm* — Wei Te Chung; Ming Chieh Chang

(57) ABSTRACT

An active plug connector (100; 300) adapted to plug into a receptacle includes a shell (11; 21; 31) defining a receiving room (114; 314), a pair of printed circuit boards (12, 13; 22, 23; 32, 33) received in the receiving room and disposed horizontally and spaced apart from each other along a vertical direction, an active element mounted on one of the two printed circuit boards, and a connecting member (14; 24; 34) electrically connected with the two printed circuit boards to share the active element. A method for assembling the active plug connector comprises inserting the connecting member into the receiving room to electrically connect with the conductive pads of the printed circuit boards to share the active element.

16 Claims, 12 Drawing Sheets

(56) References Cited

U.S. PATENT DOCUMENTS

| | | | | |
|---|---|---|---|---|
| 7,679,923 | B2 * | 3/2010 | Inagaki et al. | 361/752 |
| 7,857,636 | B2 * | 12/2010 | Su et al. | 439/76.1 |
| 8,187,019 | B2 | 5/2012 | Reed et al. | |
| 8,770,990 | B2 * | 7/2014 | Sytsma et al. | 439/76.1 |
| 2007/0230878 | A1 * | 10/2007 | Nakazawa et al. | 385/92 |
| 2011/0031379 | A1 * | 2/2011 | Ishigami et al. | 250/216 |
| 2011/0286193 | A1 * | 11/2011 | Duarte | H05K 1/147 361/803 |
| 2012/0129396 | A1 * | 5/2012 | Wang et al. | 439/607.01 |
| 2012/0214324 | A1 * | 8/2012 | Wu | 439/271 |

FOREIGN PATENT DOCUMENTS

| | | | |
|---|---|---|---|
| CN | 201576781 | U | 9/2010 |
| CN | 102210065 | A | 10/2011 |
| CN | 102480070 | A | 5/2012 |
| EP | 0346206 | A | 12/1989 |

* cited by examiner

ACTIVE PLUG CONNECTOR AND METHOD FOR ASSEMBLING THE SAME

BACKGROUND OF THE INVENTION

1. Field of the Invention

The present invention relates to an active plug connector and method for assembling the same, and more particularly to an internal connection structure and related method of assembling.

2. Description of Related Arts

U.S. Pat. No. 8,187,019, issued on May 29, 2012 to Reed et al., discloses a high speed plug connector. The plug connector comprises a shell, a pair of printed circuit boards received in the shell, and a pair of cables electrically connected with the printed circuit boards, respectively. The pair of printed circuit boards are spaced apart from each other along a vertical direction. The plug connector disclosed can be either passive copper cable based or active copper cable capable. In either case, the pair of printed circuit boards are independently working. In the case of an active plug connector, one or more active components or elements are needed in each of the two printed circuit boards, thus adding costs.

Hence, an improved active plug connector and method for assembling the same are desired to offer advantages over the related art.

SUMMARY OF THE INVENTION

An object of the present invention is to provide an active plug connector with the two printed circuit boards thereof electrically connected to each other.

To achieve the above-mentioned object, an active plug connector adapted to plug into a receptacle comprises: a shell defining a receiving room; a pair of printed circuit boards received in the receiving room, the two printed circuit boards disposed horizontally and spaced apart from each other along a vertical direction; an active element mounted on one of the two printed circuit boards; and a connecting member electrically connected with the two printed circuit boards to share the active element.

Another object of the present invention is to provide a method of assembling an active plug connector with the two printed circuit boards thereof electrically connected to each other.

To achieve the above-mentioned object, a method for assembling an active plug connector comprises the steps of: providing a shell to have a plurality of side walls and a receiving room formed by the side walls; disposing a mounting hole on one of the side walls to be in communication with the receiving room; mounting a pair of printed circuit boards in the receiving room horizontally and spacedly apart from each other; mounting an active element on one of the printed circuit boards, each of the printed circuit boards comprising a plurality of conductive pads disposed at a same side; and inserting a connecting member into the receiving room through the mounting hole to electrically connect with the conductive pads of the printed circuit boards to share the active element.

According to the present invention, the connecting member electrically connects with the pair of printed circuit boards. Therefore, the pair of printed circuits may share the active element mounted on one of the printed circuit boards to reduce cost.

DETAILED DESCRIPTION OF THE PREFERRED EMBODIMENT

Figure 1:
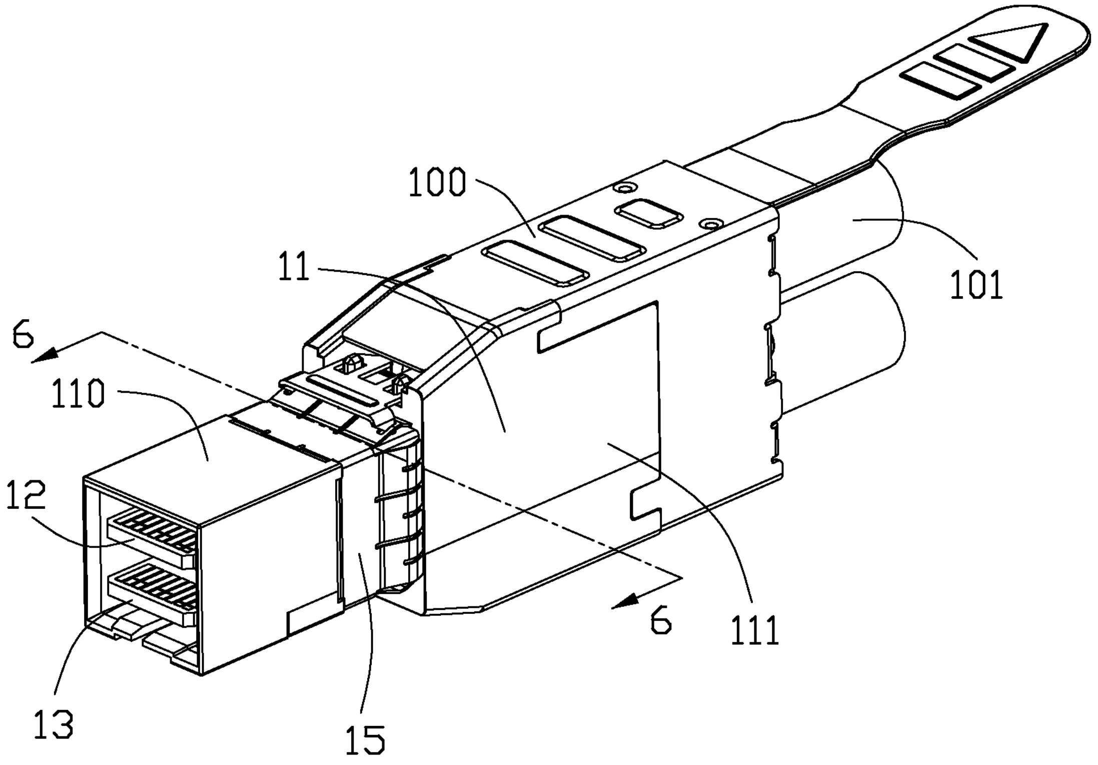
FIG. 1 is a perspective view of an active plug connector in accordance with a first embodiment of the present invention connecting with a pair of cables.

Reference will now be made in detail to a preferred embodiment of the present invention.

Referring to FIGS. 1 to 6, an active plug connector 100 in accordance with a first embodiment of present invention, comprises a shell 11, a first printed circuit board 12 received in the shell 11, a second printed circuit board 13 received in the shell 12, a connecting member 14 electrically connecting with the first printed circuit board 12 and the second printed circuit board 13, a shielding ring 15 enclosing the shell 11, and a supporting member 16 disposed between the first printed circuit board 12 and the second printed circuit board 13. The active plug connector 100 has an end adapted to plug into a receptacle (not shown), and an opposite end connected with a pair of copper cables 101. In other applications, optical cable or optical cable connector assembly can be used. The first printed circuit board 12 and the second printed circuit board 13 electrically connect with the pair of cables 101, respectively.

Figure 2:
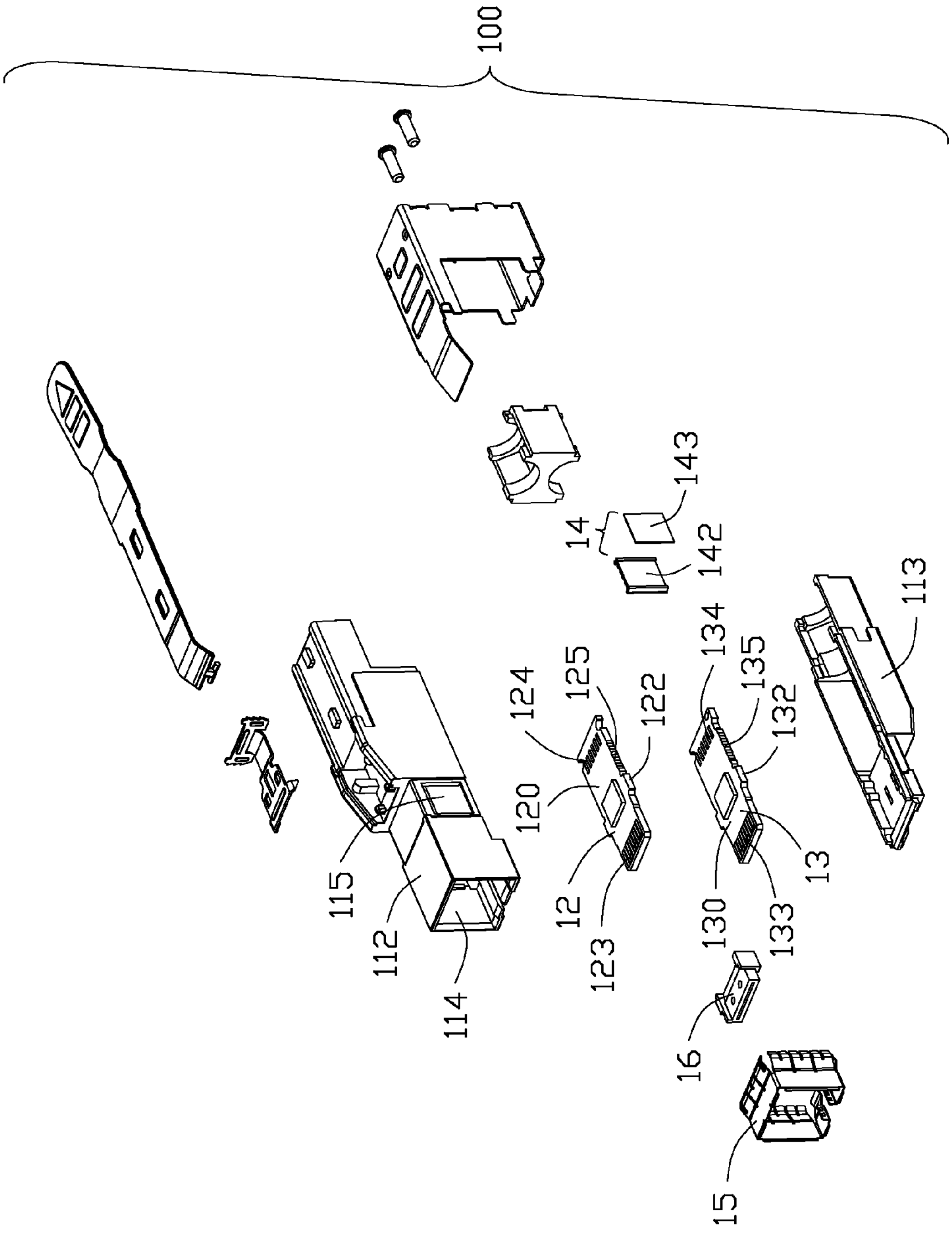
FIG. 2 is an exploded view of the active plug connector as shown in FIG. 1.
Figure 3:
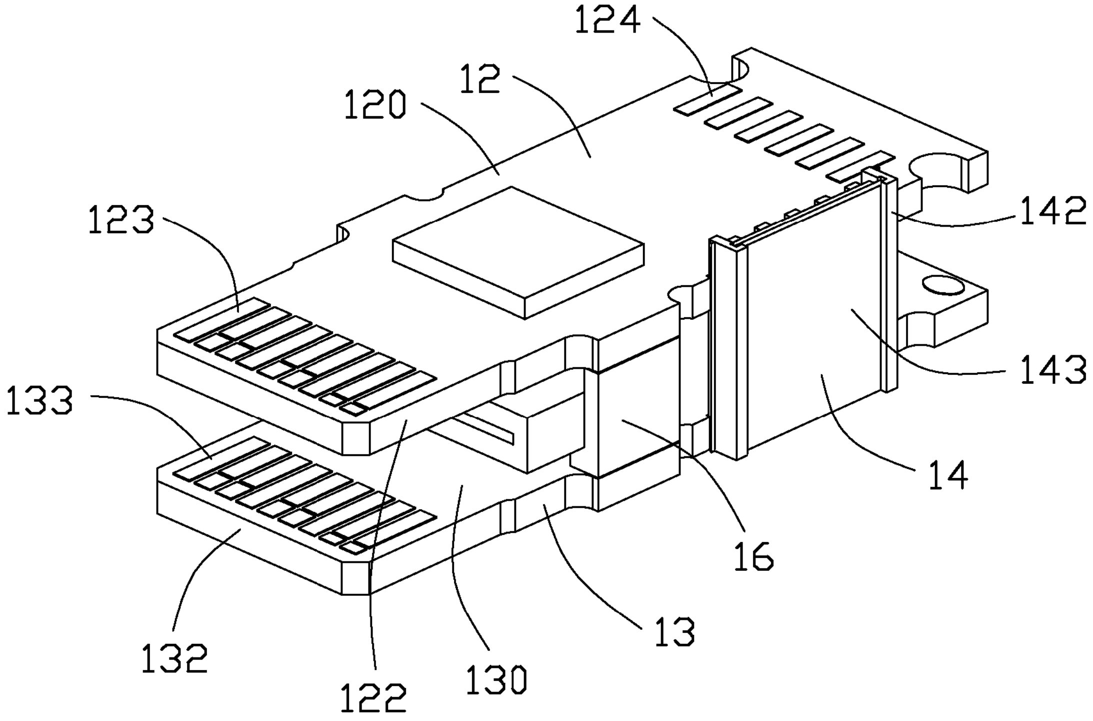
FIG. 3 is a perspective view of a connecting member connected with a pair of printed circuit boards of the active plug connector as shown in FIG. 1.
Figure 4:
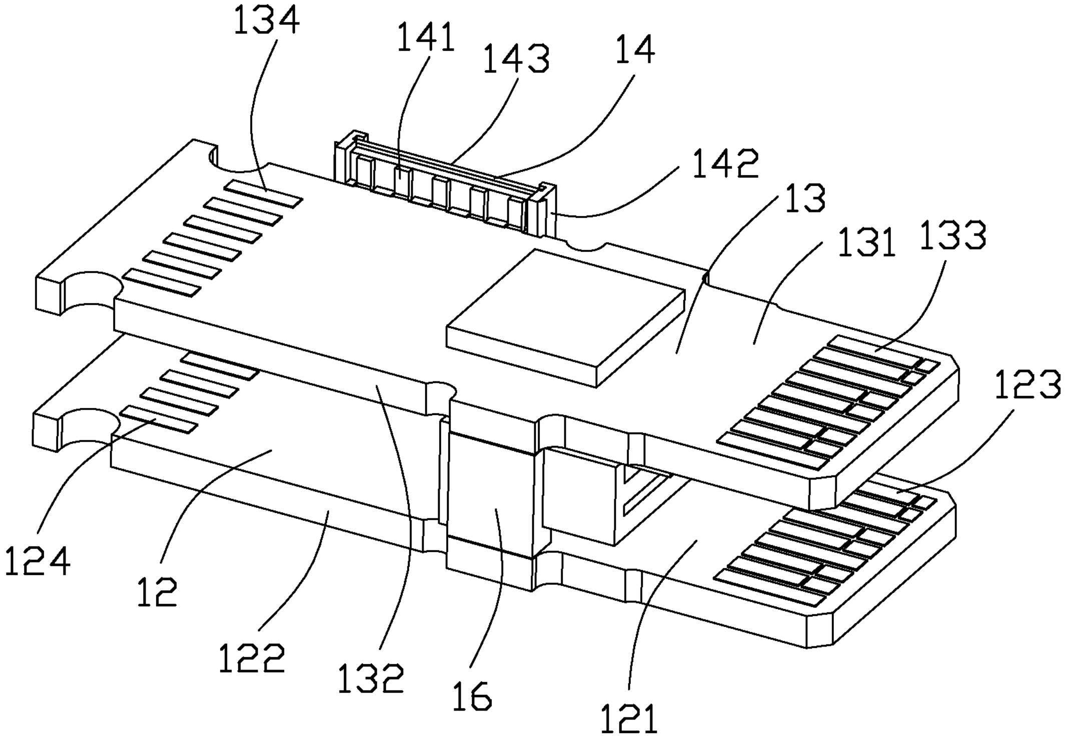
FIG. 4 is another perspective view of the connecting member connecting with the pair of printed circuit boards as shown in FIG. 3.
Figure 5:
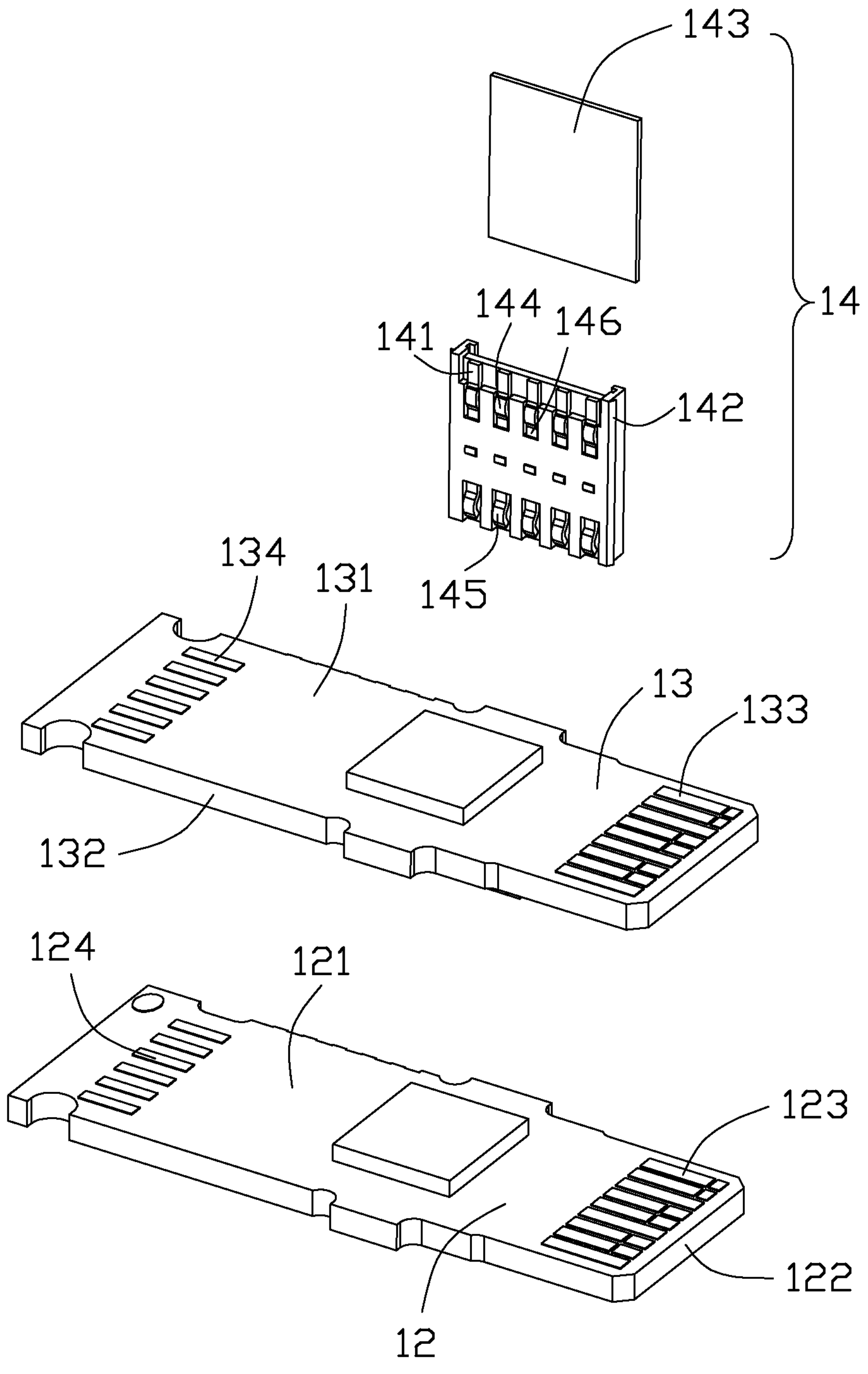
FIG. 5 is an exploded view of the connecting member connecting and the pair of printed circuit boards as shown in FIG. 3.
Figure 6:
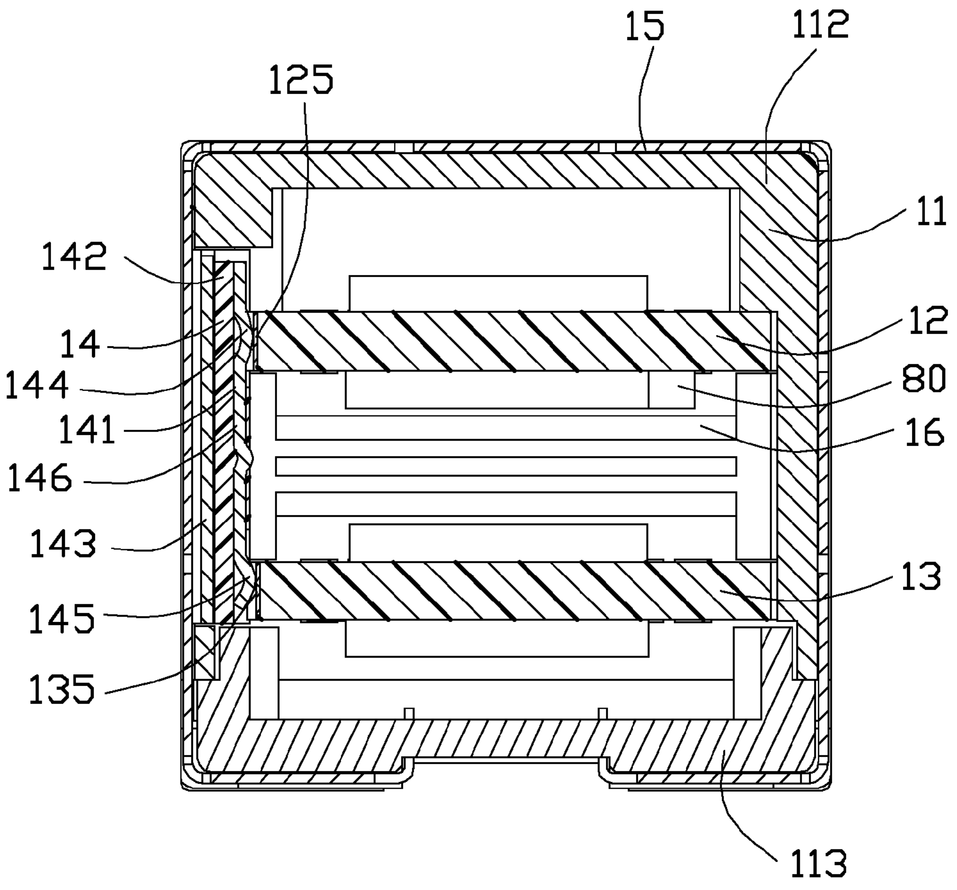
FIG. 6 is a cross-sectional view of the active plug connector taken along line 6-6 in FIG. 1.

Referring to FIGS. 2 and 6, the shell 11 is manufactured by die casting process. The shell 11 comprises a mating portion 110 for being inserted into the receptacle, and a body portion 111 connecting with the mating portion 110. The body portion 111 has a dimension greater than a dimension of the mating portion 110. The shell 11 comprises a first shell 112 and a second shell 113 mating with the first shell 112. The shell 11 comprises a plurality of side walls and a receiving room 114 formed by the side walls. One of the side walls defines a mounting hole 115 in communication with the receiving room 114. The mounting hole 115 is defined at the mating portion 110 so that the connecting member 14 can be inserted in the receiving room 114 to electrically connect the first printed circuit board 12 and the second circuit board 13. The hole 115 is then sealed by the connecting member 14.

Referring to FIGS. 1 to 6, the first printed circuit board 12 and the second printed circuit board 13 have a rectangular shape. The first and the second printed circuit boards 12, 13 are received in the receiving room 114. The first and the second printed circuit boards 12, 13 are disposed horizontally and spaced apart from each other along a vertical direction. The first printed circuit board 12 comprises a top wall 120, a bottom wall 121 parallel to the top wall 120, and four side walls 122 connecting the top wall 120 and the bottom wall 121. The active plug connector 100 comprises an active element 80 such as I2C switch, driver IC, etc mounted on one of the first and the second printed circuit boards 12, 13. The first printed circuit board 12 comprises a plurality of mating pads 123 disposed at a front end for mating with the receptacle, a plurality of soldering pads 124 disposed at a rear end for soldering with one of the cables 101, and a plurality of connecting pads 125 disposed at one of the side walls 122 for electrically connecting with the connecting member 14. The second printed circuit board comprises 13 a top wall 130, a bottom wall 131 parallel to the top wall 120, and four side walls 132 connecting the top wall 130 and the bottom wall 131. The second printed circuit board 13 comprises a plurality of mating pads 133 disposed at a front end for mating with the receptacle, a plurality of soldering pads 134 disposed at a rear end for soldering with the other cable 101, and a plurality of connecting pads 135 disposed at one of the side walls 132 for electrically connecting with the connecting member 14. The connecting pads 125 of the first printed circuit board 12 and the connecting pads 135 of the second printed circuit board 13 are disposed at a same side. Therefore, the first and the second printed circuit boards 12, 13 share the one active element by way of the connecting member 14.

Referring to FIGS. 2 to 6, the connecting member 14 comprises an insulative holder 142, a plurality of contacts 141 fixed by the insulative holder 142, and a metal plate 143 mounted on the insulative holder 142. Each of the contacts 141 comprises a first connecting portion 144 connected with the connecting pad 125 of the first printed circuit board 12, a second connecting portion 145 connected with the connecting pad 135 of the second printed circuit board 13, and a middle portion 146 connected between the first and the second connecting portions 144, 145. The first connecting portion 144 and the second connecting portion 145 are disposed at a same side of the insulative holder 142, and the metal plate 143 is mounted on a side of the insulative holder 142 opposite to the contacts 141. The first connecting portion 144 presses against the conductive pad 125 of the first printed circuit board 12, and the second connecting portion 145 presses against the conductive pad 135 of the second printed circuit board 13. The shielding ring encloses the mounting hole 115.

Figure 7:
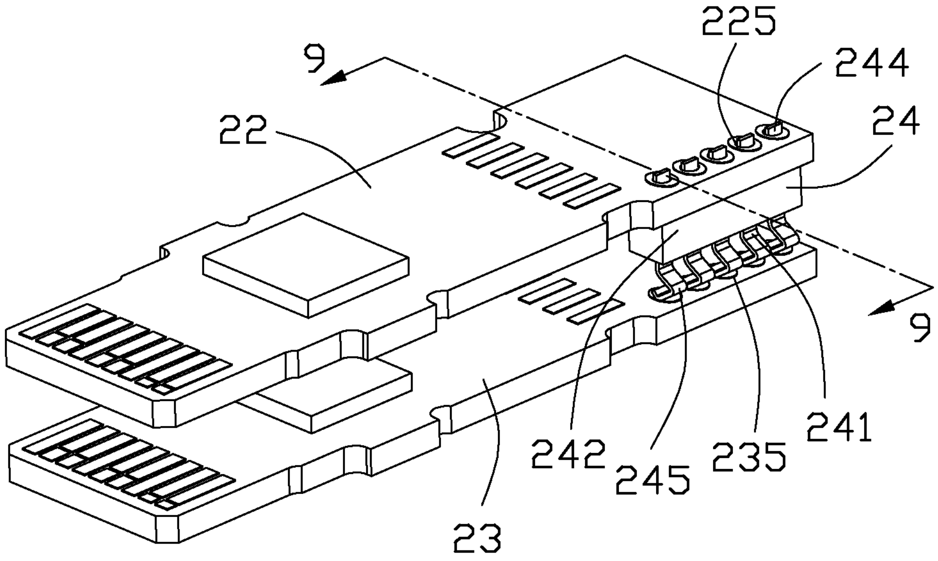
FIG. 7 is a perspective view of a connecting member connected with a pair of printed circuit boards in accordance with a second embodiment of the present invention.
Figure 8:
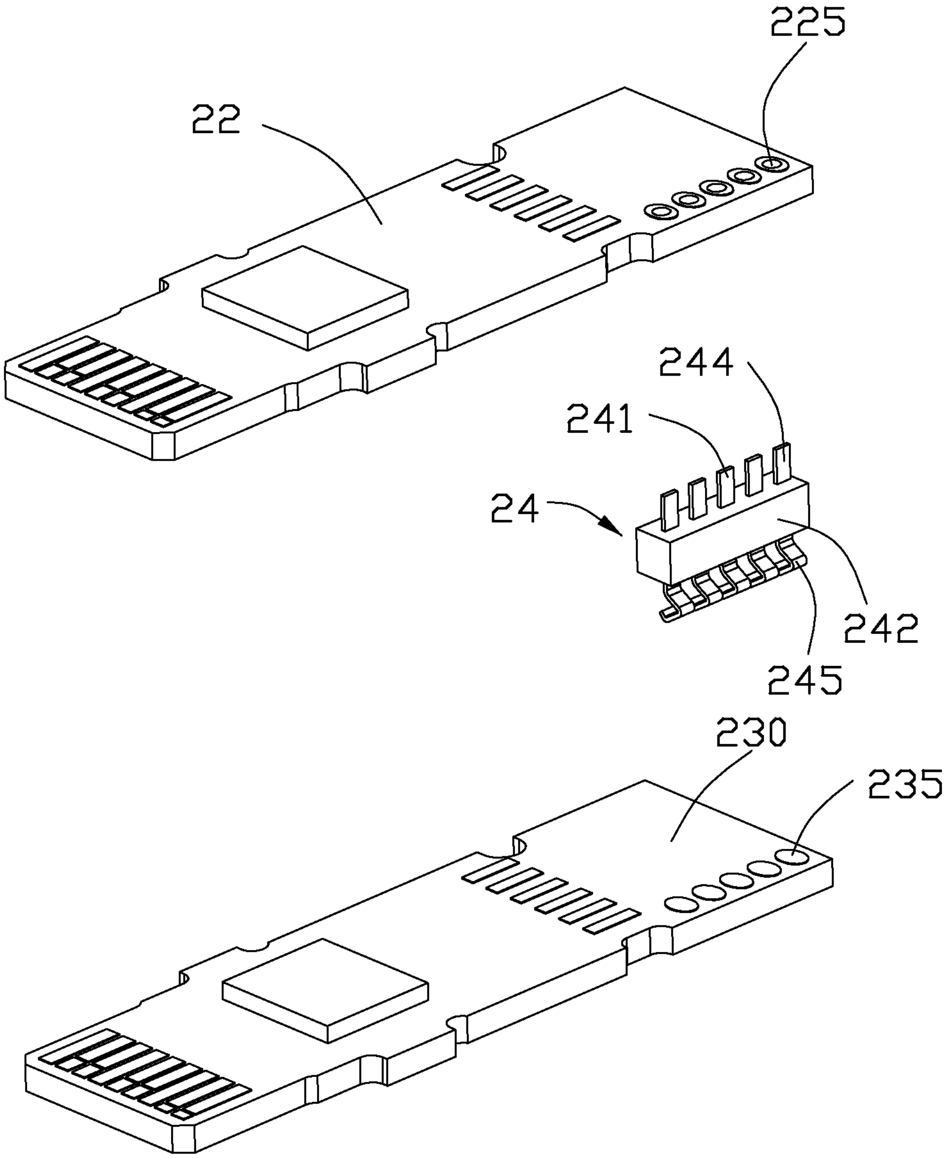
FIG. 8 is an exploded view of the connecting member and the pair of printed circuit boards as shown in FIG. 7.
Figure 9:
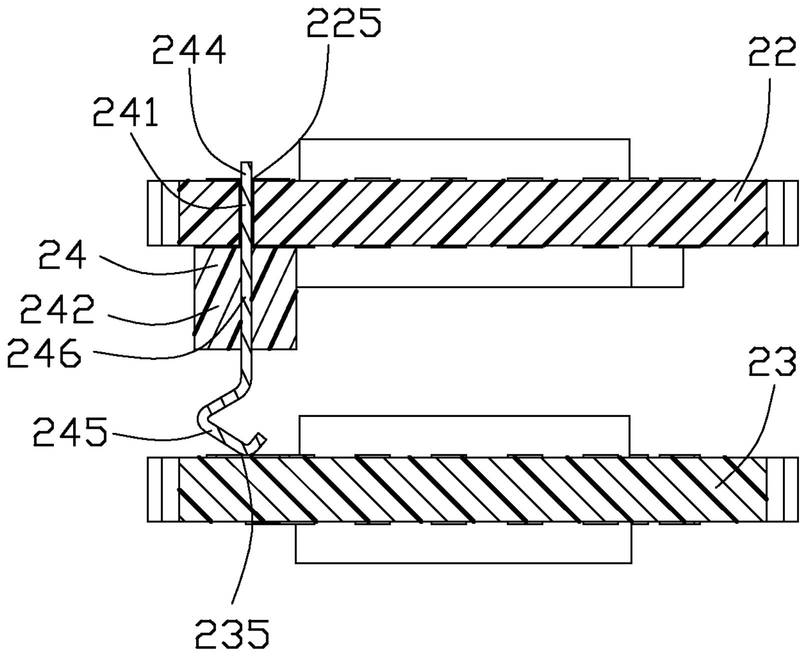
FIG. 9 is a cross-sectional view of the active plug connector taken along line 9-9 in FIG. 7.

Referring to FIGS. 7 to 9, an active plug connector in accordance with a second embodiment of present invention comprises a first printed circuit board 22, a second printed circuit board 23, and a connecting member 24 electrically connected therebetween. The first printed circuit board 22 defines a plurality of through holes 225 extending through the top and bottom walls. The second printed circuit board 23 comprises a plurality of connecting pads 235 at a top wall. The connecting member 24 comprises an insulative holder 242 and a plurality of contacts 241 fixed by the insulative holder 242. Each of the contacts 241 comprises a first connecting portion 244 electrically connecting with the first printed circuit board 22, a second connecting portion 245 electrically connecting with the second printed circuit boards 23, and a middle portion 246 connected between the first and the second connecting portions 244, 245. The middle portion 246 is embedded in the insulative holder 242, the first connecting portion 244 extends beyond a side of the insulative holder 242, and the second connecting portion 245 extends beyond an opposite side of the insulative holder 242. The first connecting portions 244 are inserted into and soldered with the through holes 225 of the first printed circuit board 22 respectively, and the second connecting portions 245 are pressed against with the connecting pads 235 of the second printed circuit board 23. Therefore, the first and the second printed circuit boards 22, 23 share the one active element by the connecting member 24.

Figure 10:
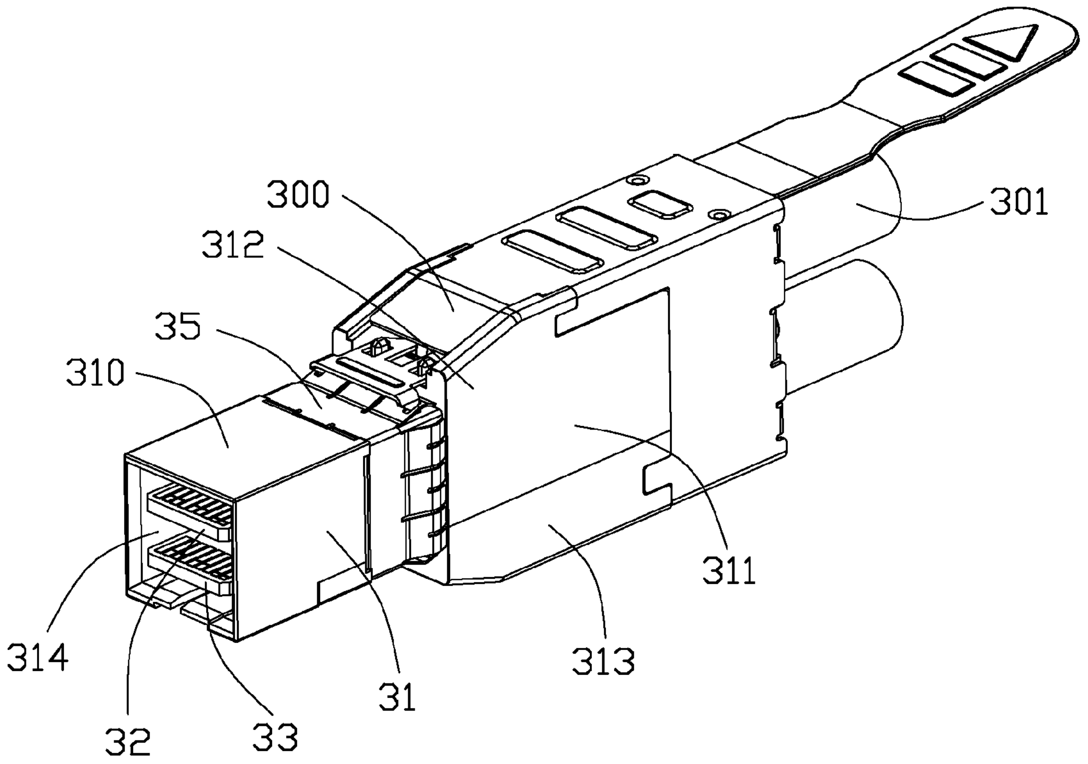
FIG. 10 is a perspective view of an active plug connector in accordance with a third embodiment of the present invention connecting with a pair of cables.
Figure 11:
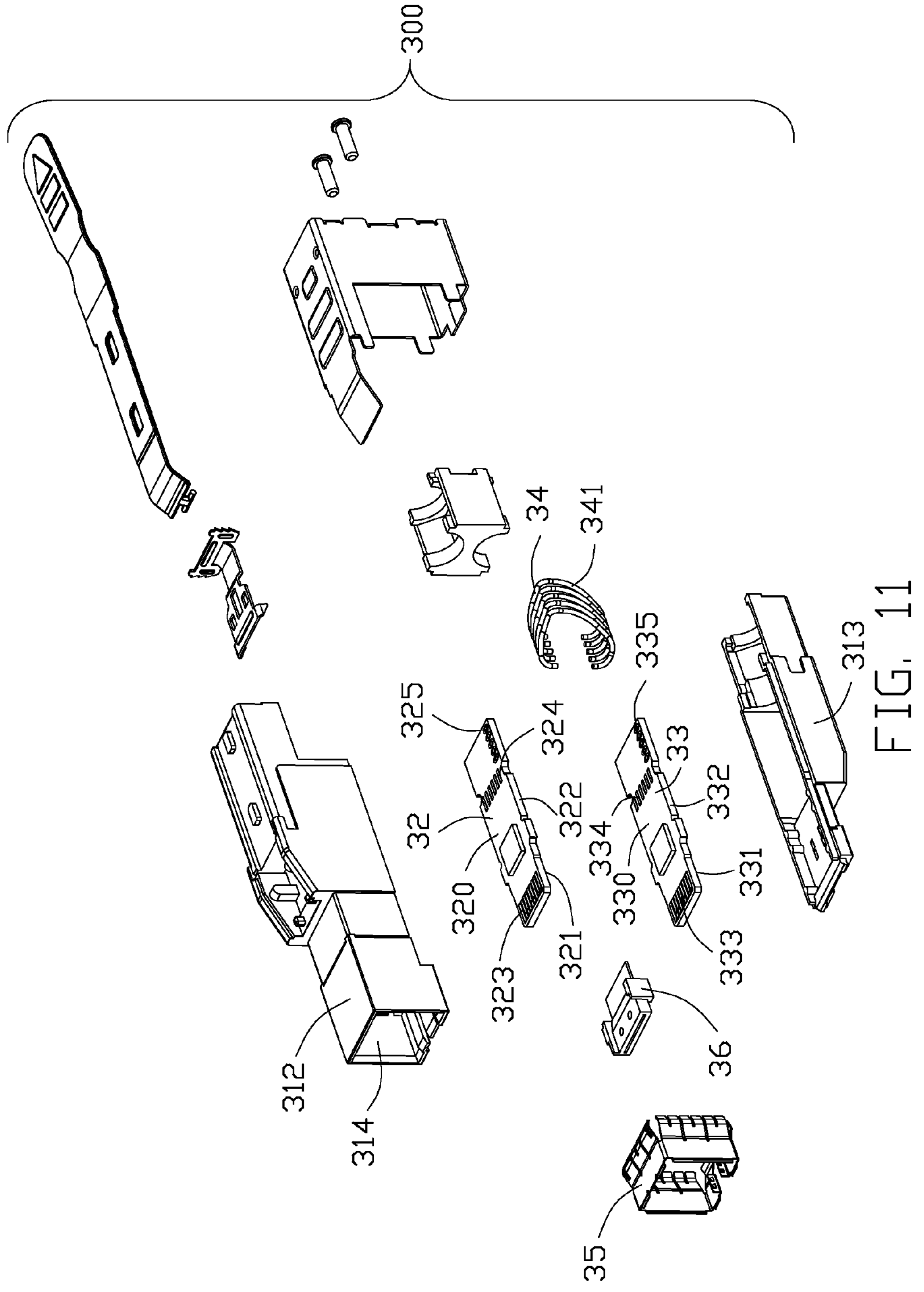
FIG. 11 is an exploded view of the active plug connector as shown in FIG. 10.
Figure 12:
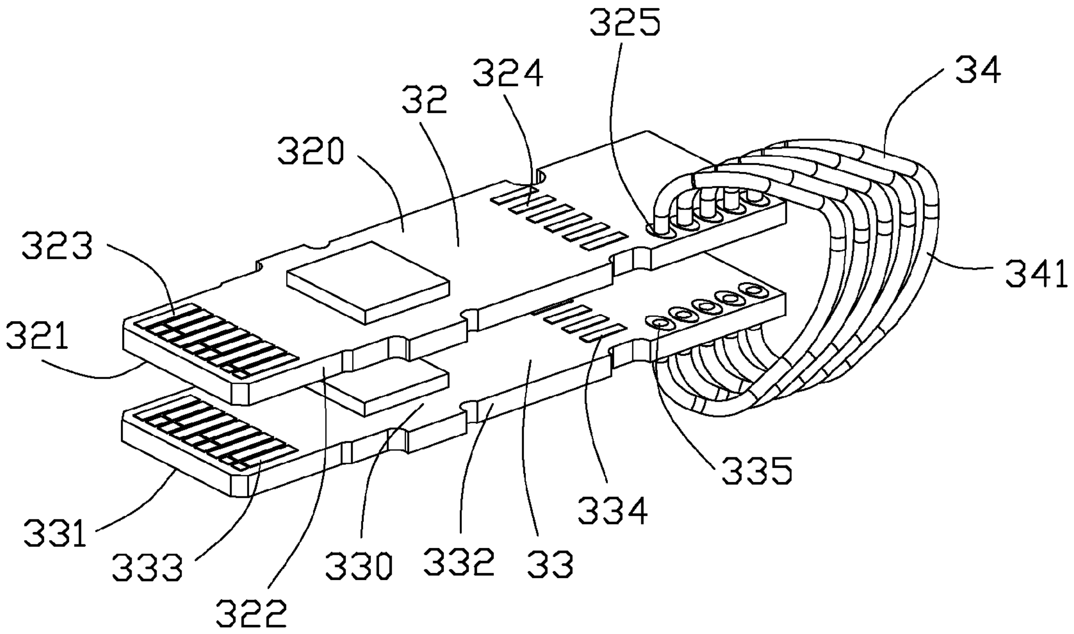
FIG. 12 is a perspective view of a connecting member connected with a pair of printed circuit boards of the active plug connector as shown in FIG. 10.

Referring to FIGS. 10 to 12, an active plug connector 300 in accordance with a third embodiment of present invention adapted to connect with a pair of cables 301 comprises a shell 31, a first printed circuit board 32 received in the shell 31, a second printed circuit board 33 parallel to the first printed circuit board 32 and received in the shell 31, a connecting member 34 electrically connected with the first printed circuit board 32 and a second printed circuit board 33, a shielding ring 35 enclosing the shell 31, and a supporting member 36 disposed between the first printed circuit board 32 and the second printed circuit board 33.

The shell 31 comprises a mating portion 310 for being inserted into the receptacle, and a body portion 311 connecting with the mating portion 310. The body portion 311 has a dimension greater than a dimension of the mating portion 310. The shell 31 comprises a first shell 312 and a second shell 313 mating with the first shell 312. The shell 31 comprises a plurality of side walls and a receiving room 314 formed by the side walls. The first printed circuit board 32 comprises a top wall 320, a bottom wall 321 parallel to the top wall 320, and four side walls 322 connecting the top wall 320 and the bottom wall 321. The first printed circuit board 32 comprises a plurality of mating pads 323 disposed at a front end for mating with the receptacle, a plurality of soldering pads 324 disposed at a rear end for soldering with one of the cables 301, and a plurality of through holes 325 arranged in a line and extending through the top wall 320 and the bottom wall 321 for electrically connecting with the connecting member 34. The second printed circuit board 33 comprises a top wall 330, a bottom wall 331 parallel to the top wall 320, and four side walls 332 connecting the top wall 330 and the bottom wall 331. The second printed circuit board 33 comprises a plurality of mating pads 333 disposed at a front end for mating with the receptacle, a plurality of soldering pads 334 disposed at a rear end for soldering with the other cable 301, and a plurality of through holes 335 arranged in a line and extending through the top wall 330 and the bottom wall 331 for electrically connecting with the connecting member 34. The through holes 325, 335 of the first printed circuit board 32 and the second printed circuit board 33 are disposed at a same side.

The connecting member 34 comprises a plurality of wires 341 arranged side by side. Each of the wire 341 has an end inserted into and soldered with the corresponding one through hole 325 of the first printed circuit board 32, and an opposite end inserted into and soldered with a corresponding through hole 335 of the second printed circuit board 33. Therefore, the first and the second printed circuit boards 32, 33 share the one active element by the connecting member 34.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An active plug connector adapted to plug into a receptacle, comprising:

a shell defining a receiving room;

a pair of printed circuit boards received in the receiving room, the two printed circuit boards disposed horizontally and spaced apart from each other along a vertical direction;

an active element mounted on one of the two printed circuit boards; and a connecting member electrically connected with the two printed circuit boards to share the active element; wherein the shell has a mounting hole in communication with the receiving room, and the connecting member is connected with the printed circuit boards through the mounting hole and thereafter the mounting hole is sealed by the connecting member.

2. The active plug connector as recited in claim 1, wherein the connecting member comprises an insulative holder and a plurality of contacts fixed by the insulative holder, each of the contacts comprising a first connecting portion connected with one of the printed circuit boards, a second connecting portion connected with the other printed circuit board, and a middle portion connected between the first and second connecting portions.

3. The active plug connector as recited in claim 2, wherein the middle portion is embedded in the insulative holder, the first connecting portion extends beyond a first side of the insulative holder, and the second connecting portion extends beyond an opposite second side of the insulative holder.

4. The active plug connector as recited in claim 3, wherein the first connecting portion is inserted into one of the printed circuit boards, and the second connecting portion presses against the other printed circuit board.

5. The active plug connector as recited in claim 2, wherein the first connecting portion and the second connecting portion are disposed at a same side of the insulative holder, and each of the printed circuit boards comprises a conductive pad disposed at a same side thereof, the first connecting portion pressing against the conductive pad of one printed circuit board, the second connecting portion pressing against the conductive pad of the other printed circuit board.

6. The active plug connector as recited in claim 1, wherein the connecting member comprises a metal plate mounted on an outer side of the insulative holder.

7. The active plug connector as recited in claim 6, further comprising a shielding ring mounted on the shell, the shielding ring enclosing the mounting hole.

8. The active plug connector as recited in claim 1, wherein the connecting member comprises a plurality of wires, each of the wires comprising an end electrically connected with one of the printed circuit boards, and an opposite end electrically connected with the other printed circuit board.

9. The active plug connector as recited in claim 8, wherein the wires are arranged side by side.

10. The active plug connector as recited in claim 1, further comprising a supporting member disposed between the printed circuit boards.

11. The active plug connector as recited in claim 1, wherein the shell comprises a mating portion for being inserted into the receptacle, and a body portion continuing the mating portion, the body portion having a dimension greater than a dimension of the mating portion.

12. The active plug connector as recited in claim 1, wherein the shell comprises a first shell part and a second shell part mating with the first shell part.

13. A method for assembling an active plug connector, comprising the steps of:

providing a shell to have a plurality of side walls and a receiving room formed by the side walls;

disposing a mounting hole on one of the side walls to be in communication with the receiving room;

mounting a pair of printed circuit boards in the receiving room horizontally spaced apart from each other;

mounting an active element on one of the printed circuit boards, each of the printed circuit boards comprising a plurality of conductive pads disposed around a same side; and inserting a connecting member into the receiving room through the mounting hole to electrically connect with the conductive pads of the printed circuit boards to share the active element.

14. The method as recited in claim 13, further comprising a step of sealing the mounting hole by the connecting member and covering the connecting member with a shielding ring.

15. The method as claimed in claim 13, wherein said connecting member includes a plurality of bulged conductive connecting portions contacting the corresponding pads, respectively.

16. The method as recited in claim 15, wherein said conductive pads are formed on a side edge facing laterally and outwardly to contact the corresponding connecting portions, respectively.

* * * * *